United States Patent
Kim et al.

(10) Patent No.: US 12,191,364 B2
(45) Date of Patent: Jan. 7, 2025

(54) SEMICONDUCTOR DEVICE WITH BURIED GATE STRUCTURE

(71) Applicant: SK hynix Inc., Gyeonggi-do (KR)

(72) Inventors: Dong Soo Kim, Gyeonggi-do (KR);
Tae Kyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 160 days.

(21) Appl. No.: 17/689,762

(22) Filed: Mar. 8, 2022

(65) Prior Publication Data
US 2023/0038881 A1  Feb. 9, 2023

(30) Foreign Application Priority Data
Aug. 5, 2021 (KR) .................. 10-2021-0103235

(51) Int. Cl.
*H01L 29/423* (2006.01)
*H10B 12/00* (2023.01)

(52) U.S. Cl.
CPC ..... *H01L 29/4236* (2013.01); *H10B 12/0335* (2023.02); *H10B 12/053* (2023.02); *H10B 12/34* (2023.02)

(58) Field of Classification Search
CPC ............ H01L 29/4236; H01L 29/4983; H10B 12/0335; H10B 12/053; H10B 12/34; H10B 12/485
See application file for complete search history.

(56) References Cited

U.S. PATENT DOCUMENTS

| | | | |
|---|---|---|---|
| 8,558,298 B2* | 10/2013 | Shinhara | H10B 12/482 257/302 |
| 2017/0186844 A1* | 6/2017 | Kim | H10B 12/053 |
| 2019/0088657 A1* | 3/2019 | Im | H10B 12/34 |
| 2020/0194438 A1 | 6/2020 | Enomoto et al. | |
| 2021/0066466 A1* | 3/2021 | Kwon | H01L 29/4238 |
| 2021/0082767 A1* | 3/2021 | Kim | H01L 21/823418 |
| 2021/0175266 A1* | 6/2021 | Lee | H01L 27/14683 |
| 2021/0320008 A1* | 10/2021 | Kim | H01L 29/4236 |
| 2022/0292669 A1* | 9/2022 | Cho | G06N 3/0475 |

OTHER PUBLICATIONS www.EESemi.com, "Properties of Silicon Dioxide (SiO2) and Silicon Nitride (Si3N4) at 300K" (Year: 2004).*
EEsemi_Silicon Dioxide (SiO2) and Silicon Nitride (Si3N4) Properties (Year: 2004).*
Sang M. Han et al., Reasons for lower dielectric constant of fluorinated SiO2 films, Journal of Applied Physics, Feb. 15, 1998, p. 2172-2178, vol. 83, No. 4, American Institute of Physics.

* cited by examiner

*Primary Examiner* — Kretelia Graham
*Assistant Examiner* — Jaesun Lee
(74) *Attorney, Agent, or Firm* — IP & T GROUP LLP

(57) ABSTRACT

Present invention relates to a semiconductor device including a buried gate structure. A semiconductor device comprises a substrate; a first fluorine-containing layer over the substrate; a trench formed in the first fluorine-containing layer and extended into the substrate; a gate dielectric layer formed over the trench; a gate electrode formed over the gate dielectric layer and filling a portion of the trench; a second fluorine-containing layer formed over the gate electrode; and a fluorine-containing passivation layer between the gate dielectric layer and the gate electrode.

22 Claims, 16 Drawing Sheets

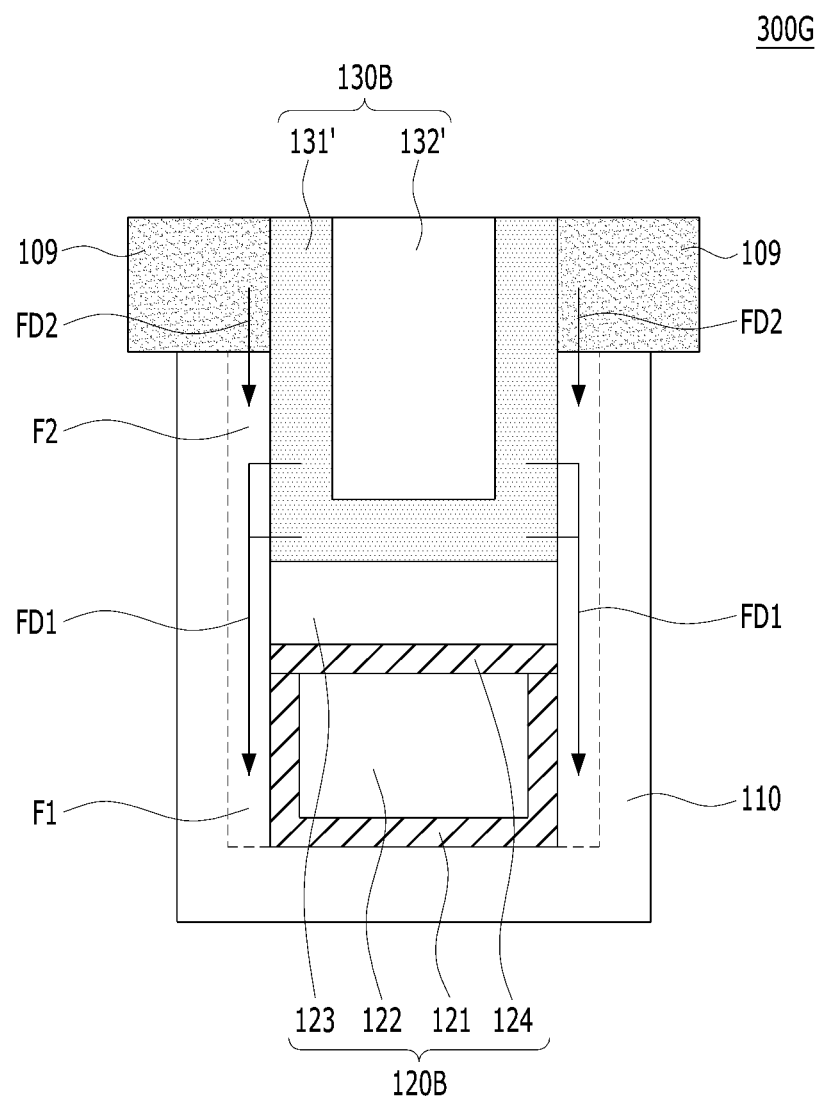

SEMICONDUCTOR DEVICE WITH BURIED GATE STRUCTURE

CROSS-REFERENCE TO RELATED APPLICATIONS

The present application claims priority to Korean Patent Application No. 10-2021-0103235, filed on Aug. 5, 2021, which is incorporated herein by reference in its entirety.

BACKGROUND

1. Field

Present invention relates to a semiconductor device and, more particularly, to a semiconductor device including a buried gate structure.

2. Description of the Related Art

Metal gate electrodes are applied for high transistor performance. Particularly in a buried gate type transistor, the high transistor performance demands a threshold voltage control. In addition, the gate induced drain leakage (GIDL) characteristics have a huge impact on the performance of the buried gate type transistor.

SUMMARY

Various embodiments of the present invention provide a semiconductor device including a buried gate structure with improved reliability.

A semiconductor device according to an embodiment of the present invention comprises a substrate; a first fluorine-containing layer over the substrate; a trench formed in the first fluorine-containing layer and extended into the substrate; a gate dielectric layer formed over the trench; a gate electrode formed over the gate dielectric layer and filling a portion of the trench; a second fluorine-containing layer formed over the gate electrode; and a fluorine-containing passivation layer between the gate dielectric layer and the gate electrode.

A semiconductor device according to an embodiment of the present invention comprises a substrate including a first doped region and a second doped region; a first SiOF layer over the substrate; a trench formed in the first SiOF layer and extended into the substrate between the first and second doped regions; a gate dielectric layer formed over the trench; a gate electrode filling a portion of the trench over the gate dielectric layer and including fluorine-free titanium nitride; a second SiOF layer formed over the gate electrode; and a fluorine-containing passivation layer between the gate dielectric layer and the gate electrode.

The present invention can improve retention and row hammer characteristics by forming a fluorine-rich capping layer over the gate electrode.

BRIEF DESCRIPTION OF THE DRAWINGS

FIGS. 5A to 5D are enlarged views illustrating buried gate structures according to embodiments of the present invention.

DETAILED DESCRIPTION

Figure 1:
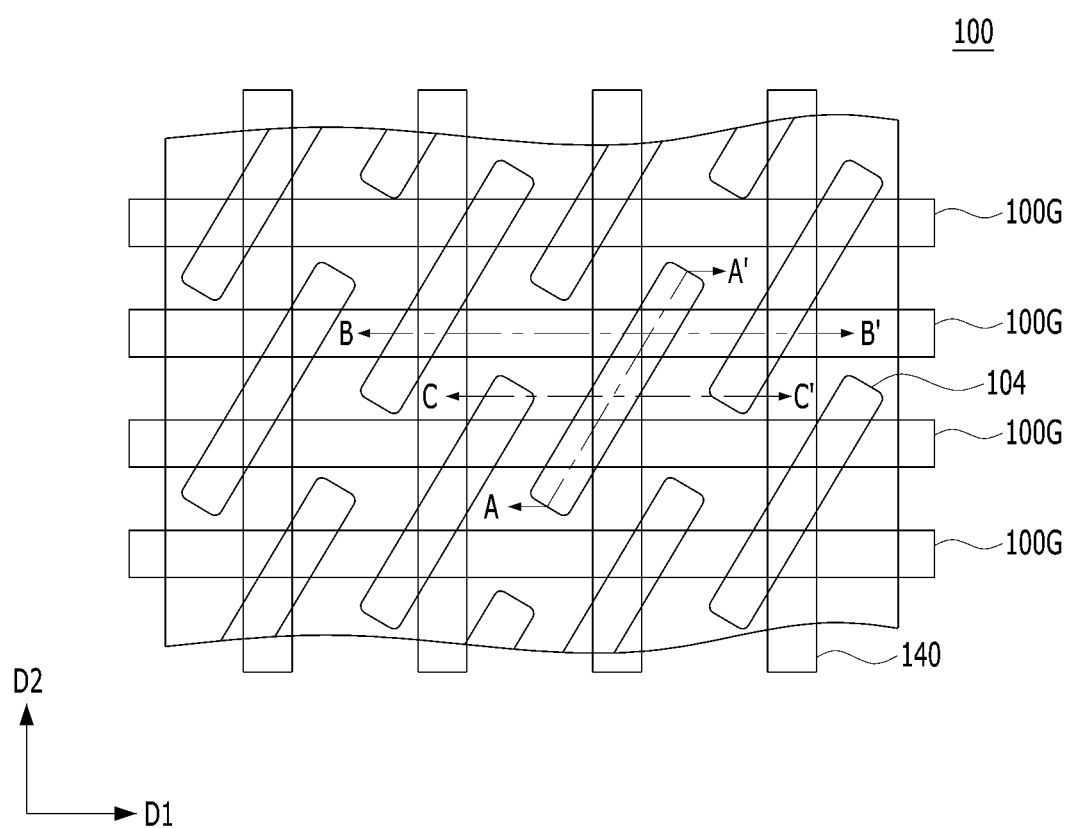
FIG. 1 is a schematic plan view illustrating a semiconductor device according to an embodiment of the present invention.

Various embodiments described herein will be described with reference to cross-sectional views, plan views and block diagrams, which are schematic views of the present invention. Therefore, the structures of the drawings may be modified by fabricating technology and/or tolerances. Various embodiments of the present invention are not limited to the specific structures shown in the drawings but include any changes in the structures that may be produced according to the fabricating process. Also, any regions and shapes of regions illustrated in the drawings have schematic views, are intended to illustrate specific examples of structures of regions of the various elements and are not intended to limit the scope of the invention.

Hereinafter, a buried gate structure according to embodiments of the present invention may be disposed in a trench. The buried gate structure may include a stack of a gate dielectric layer, a gate electrode, and a capping layer. The gate dielectric layer may cover a surface of the trench. The gate electrode may partially fill the trench over the gate dielectric layer. The capping layer may fill the remaining portion of the trench over the gate electrode. Therefore, the gate electrode may be referred to as a 'buried gate electrode.'

The gate electrode may include a single gate or a dual gate. The single gate may refer to a gate formed only of either polysilicon or a metal-based material. The single gate may include a polysilicon single gate or a metal single gate. The dual gate may refer to a bilayer stack including different gate electrodes. The dual gate electrode may include a same metal dual gate including a stack of two layers made of the same metal, a dissimilar metal dual gate including a stack of two layers made of different metals, or a dissimilar material dual gate formed of a stack of one layer made of a metal and one layer made of polysilicon.

The gate electrode may include a barrier layer and a low resistivity material. The barrier layer may serve to block an impurity diffused from the low resistivity material or to prevent inter-diffusion and reaction between two different materials. The low resistivity material may serve to decrease sheet resistance of the gate electrode.

The gate electrode may include a material having an engineered work function. The engineering of the work function may refer to a material or a method that may adjust the work function to have a reduced work function (i.e., a low work function) or an increased work function (i.e., a high work function).

According to an embodiment of the present invention, the gate electrode may include a lower gate and an upper gate. The lower gate may fill a lower portion of the trench, and the upper gate may fill middle and upper portions of the trench. As described above, the gate electrode may be referred to as a dual gate in which the upper gate is disposed on the lower gate. The lower gate may overlap with a channel. The upper gate may laterally overlap with first and second doped regions (i.e., source and drain regions).

Figure 2A:
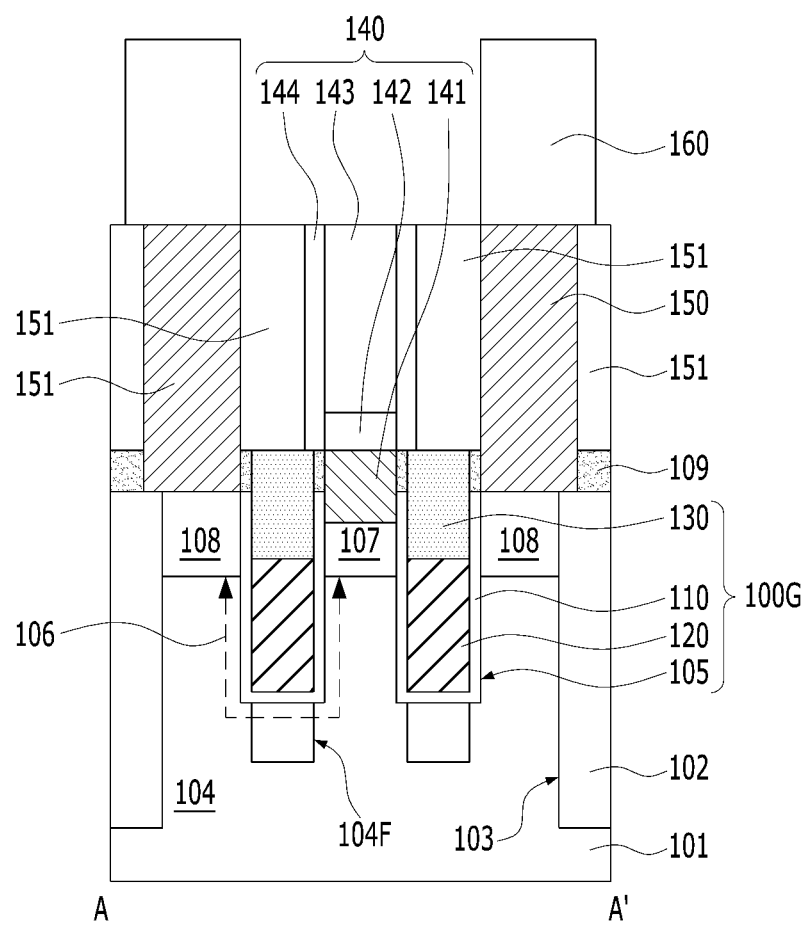
FIG. 2A is a cross-sectional view taken along line A-A' of FIG. 1.
Figure 2B:
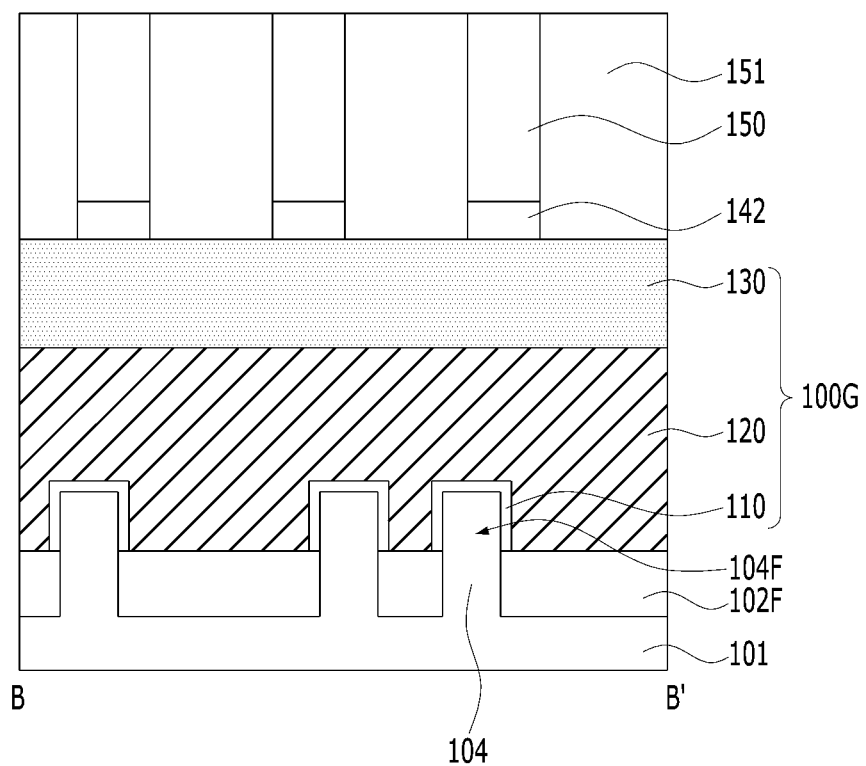
FIG. 2B is a cross-sectional view taken along line B-B' of FIG. 1.
Figure 2C:
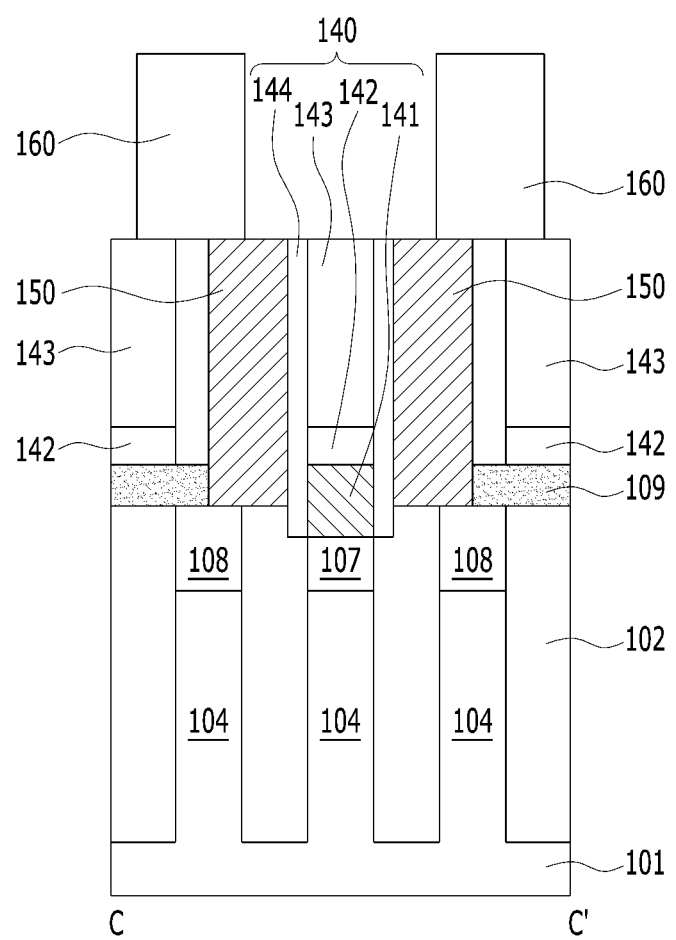
FIG. 2C is a cross-sectional view taken along line C-C' of FIG. 1.
Figure 2D:
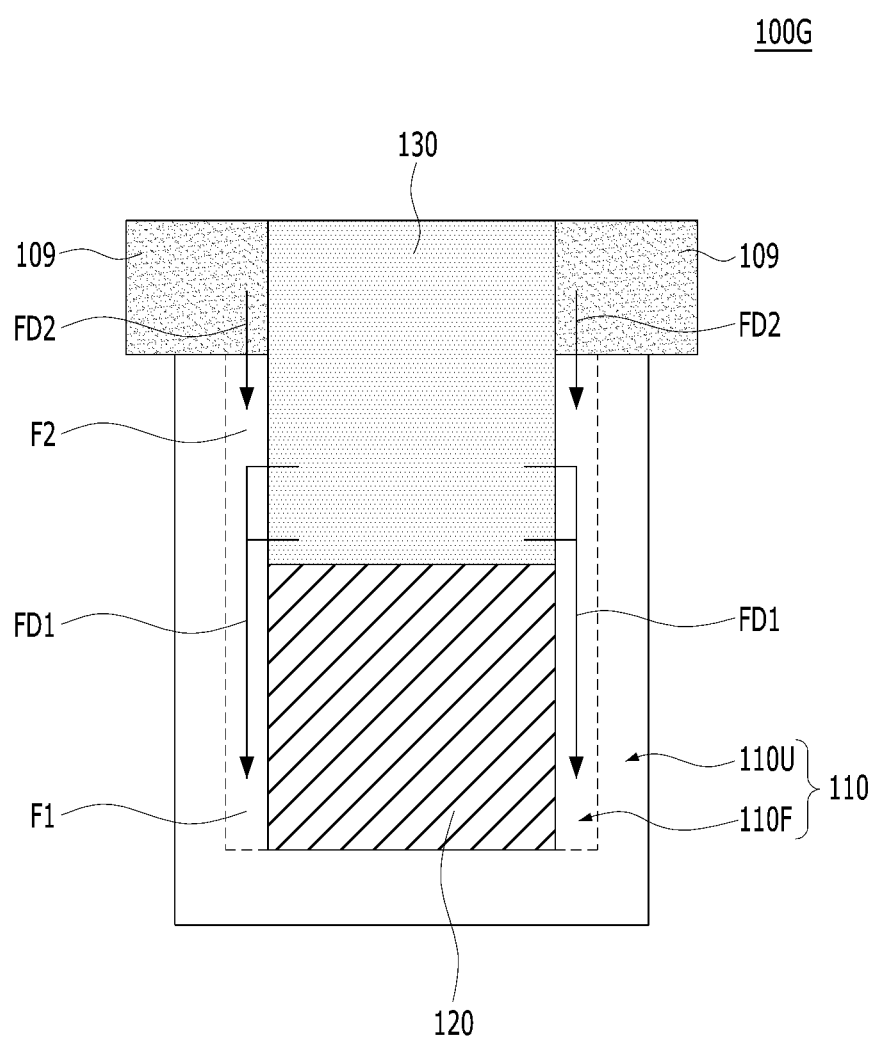
FIG. 2D is an enlarged view of a buried gate structure 100G.

FIG. 1 is a schematic plan view illustrating a semiconductor device according to an embodiment of the present invention. FIG. 2A is a cross-sectional view taken along line A-A' of FIG. 1. FIG. 2B is a cross-sectional view taken along line B-B' of FIG. 1. FIG. 2C is a cross-sectional view taken along line C-C' of FIG. 1. FIG. 2D is an enlarged view of a buried gate structure 100G.

Referring to FIGS. 1 to 2D, the semiconductor device 100 may include a substrate 101, a buried gate structure 100G, a bit line structure 140, and a capacitor 160. The semiconductor device 100 may be a part of a memory cell. For example, the semiconductor device 100 may be a part of a memory cell of a DRAM.

The substrate 101 may be a material suitable for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, combinations thereof, or multi-layers thereof. The substrate 101 may include another semiconductor material, such as germanium. The substrate 101 may include an III/V-group semiconductor substrate, for example, a chemical compound semiconductor substrate such as gallium arsenide (GaAs). The substrate 101 may include a Silicon-On-Insulator (SOI) substrate.

An isolation layer 102 and an active region 104 may be formed in the substrate 101. The active region 104 may be defined by the isolation layer 102. The isolation layer 102 may be a Shallow Trench Isolation (STI) region formed by trench etching. The isolation layer 102 may be formed by filling a shallow trench, for example, an isolation trench 103, with a dielectric material. The isolation layer 102 may be made of or include silicon oxide, silicon nitride, or a combination thereof.

A trench 105 may be formed in the substrate 101. Referring to FIG. 1, the trench 105 may have a line shape extended in a first direction D1. The trench 105 may have a line shape crossing the active region 104 and the isolation layer 102. The trench 105 may have a shallower depth than the isolation trench 103. In another embodiment, the trench 105 may be a space in which the buried gate structure 100G is to be formed and may also be referred to as a "gate trench".

First and second doped regions 107 and 108 may be formed in the active region 104. The first and second doped regions 107 and 108 are regions doped with conductive dopants. For example, the conductive dopants may include phosphorus (P), arsenic (As), antimony (Sb), or boron (B). The first and second doped regions 107 and 108 may be doped with the same conductive dopant. The first and second doped regions 107 and 108 may be located in the active region 104 on both sides of the trench 105. The bottom surfaces of the first and second doped regions 107 and 108 may be located at a predetermined depth from the top surface of the active region 104.

The first and second doped regions 107 and 108 may contact the sidewalls of the trench 105. The bottom surfaces of the first and second doped regions 107 and 108 may be located at a level higher than the bottom surface of the trench 105. The first doped region 107 may be referred to as a "first source/drain region", and the second doped region 108 may be referred to as a "second source/drain region". A channel 106 may be defined between the first doped region 107 and the second doped region 108 by the buried gate structure 100G. The channel 106 may be defined along the profile of the trench 105.

The active region 104 may include a fin region 104F. The fin region 104F may be formed below the trench 105. The fin region 104F is formed as the isolation layer 102 which is disposed below the trench 105 is partially recessed. The sidewalls of the fin region 104F are exposed by a recessed isolation layer 102F. The fin region 104F is a region in which a part of the channel CH may be formed. The fin region 104F is also called a "saddle fin". The fin region 104F may increase the channel width and improve the electrical characteristics. In another embodiment, the fin region 104F may be omitted.

In another embodiment, the active region 104 and the fin region 104F may include oxide semiconductor materials such as IGZO (InGaZnO). In this case, the first and second doped regions 107 and 108 may also include oxide semiconductor materials such as IGZO. The active region 104 and the fin region 104F may be formed of IGZO, and the first and second doped regions 107 and 108 may be formed of an oxide semiconductor material having a lower resistivity than IGZO.

According to FIG. 1, the buried gate structure 100G may be extended in the first direction D1. The buried gate structure 100G may include a gate dielectric layer 110 covering the bottom surface and the sidewalls of the trench 105, a gate electrode 120 partially filling the trench 105 over the gate dielectric layer 110, and a capping layer 130 disposed over the gate electrode 120.

The gate dielectric layer 110 may be made of or include silicon oxide, silicon nitride, silicon oxynitride, a high-k material or a combination thereof. The high-k material may be or include a material having a higher dielectric constant than silicon oxide. For example, the high-k material may be or include any suitable material having a dielectric constant greater than, for example, 3.9. In an embodiment, the high-k material may be or include a material having a dielectric constant greater than, for example, 10. In another embodiment, the high-k material may be or include a material having a dielectric constant ranging from 10 to 30. The high-k material may be or include at least one metallic element. The high-k material may be or include a hafnium-containing material. The hafnium-containing material may be or include hafnium oxide, hafnium silicon oxide, hafnium silicon oxynitride or a combination thereof. In another embodiment, the high-k material may be or include lanthanum oxide, lanthanum aluminum oxide, zirconium oxide, zirconium silicon oxide, zirconium silicon oxynitride, aluminum oxide or a combination thereof. As the high-k material, other known high-k materials may also be selectively used. The gate dielectric layer 110 may be or include metal oxide.

The gate electrode 120 may be disposed at a level lower than the upper surface of the active region 104, that is, the first and second doped regions 107 and 108. The gate electrode 120 may include a fluorine-free material. A fluorine-free material may refer to a material that does not contain fluorine. The gate electrode 120 may include a metal-based material that is fluorine-free. The gate electrode 120 may include a metal, a metal nitride, or a combination thereof. The gate electrode 120 may include, for example, polysilicon, tantalum nitride (TaN), titanium nitride (TiN), tungsten (W), tungsten nitride (WN), molybdenum (Mo), ruthenium (Ru), or a combination thereof. Tungsten (W) and tungsten nitride (WN) may be used as the gate electrode 120 and formed by using a fluorine-free precursor. The gate electrode 120 may be formed only of fluorine-free titanium nitride. In another embodiment, the gate electrode 120 may have a high work function. Here, the high work function refers to a work function higher than the mid-gap work function of silicon. A low work function refers to a work function that is lower than the mid-gap work function of silicon. In other words, the high work function may have a work function higher than 4.5 eV, and the low work function may have a work function lower than 4.5 eV. The gate electrode 120 may include P-type polysilicon or nitrogen-rich TiN.

In another embodiment, the gate electrode 120 may have an increased high work function. The gate electrode 120 may be made of or include metal silicon nitride. The metal silicon nitride may be metal nitride doped with silicon. The gate electrode 120 may be made of or include metal silicon nitride having an adjusted atomic percentage of silicon. For example, the gate electrode 120 may be made of or include tantalum silicon nitride (TaSiN) or titanium silicon nitride (TiSiN). Titanium nitride may have a high work function and contain silicon to further increase the work function thereof. Titanium silicon nitride may have an adjusted atomic percentage of silicon, so as to have an increased high work function. In another embodiment, the gate electrode 120 may include, for example, titanium aluminum nitride (TiAlN).

The capping layer 130 may serve to protect the gate electrode 120. The capping layer 130 may fill the upper portion of the trench 105 and may be formed on the gate electrode 120. The top surface of the capping layer 130 may be located at the same level as the top surface of the first and second doped regions 107 and 108.

A hard mask layer 109 may be formed on both sides of the capping layer 130. The hard mask layer 109 may be made of or include a dielectric material. The hard mask layer 109 may be formed on the substrate 101 and cover the active region 104 and the isolation layer 102. The capping layer 130 of the buried gate structure 100G may penetrate the hard mask layer 109. The trench 105 may extend through the hard mask layer 109 into the substrate 101.

The bit line structure 140 may be connected to the first doped region 107 by passing through the hard mask layer 109. Referring to the plan view of FIG. 1, the bit line structure 140 may extend in the second direction D2. The bit line structure 140 may include a bit line contact plug 141, a bit line 142, a bit line hard mask layer 143, and a spacer 144. The bit line contact plug 141 may directly contact the first doped region 107, and the bit line 142 may be formed on the bit line contact plug 141. The bit line hard mask layer 143 may be formed on the bit line 142, and the spacer 144 may be formed on both sidewalls of the bit line contact plug 141, the bit line 142, and the bit line hard mask layer 143. The bit line contact plug 141 may include, for example, polysilicon. The bit line 142 may include, for example, titanium nitride, tungsten, or a combination thereof. The bit line hard mask layer 143 may include, for example, silicon nitride. The spacer 144 may include, for example, a nitride, an oxide, a low-k material, or a combination thereof. The low-k material as the spacer 144 may include SiBN, SiCO, SiCN, SiBCN, or a combination thereof. In an embodiment, the spacer 144 may include a stack of insulating materials having an air gap embedded in the insulating materials.

The storage node contact plugs 150 may be connected to the second doped regions 108, respectively, by passing through the hard mask layer 109. A capacitor 160 may be formed on the storage node contact plugs 150. A plug isolation layer 151 may be formed between consecutively disposed storage node contact plugs 150. The plug isolation layer 151 may also be positioned between consecutively disposed bit line structures 140. The storage node contact plug 150 may include, for example, polysilicon, metal silicide, metal nitride, metal, or a combination thereof. In an embodiment, the storage node contact plug 150 may be a stack of polysilicon, cobalt silicide, titanium nitride, and tungsten which are sequentially stacked. The plug isolation layer 151 may include, for example, silicon nitride, a low-k material, or a combination thereof. The low-k material as the plug isolation layer 151 may include SiBN, SiCN, SiBCN, or a combination thereof.

The capping layer 130 and the gate dielectric layer 110 may be in direct contact. The capping layer 130 and the gate electrode 120 also may be in direct contact. The capping layer 130 may include a fluorine-containing material. The capping layer 130 may include a fluorine-rich layer. The hard mask layer 109 may include a fluorine-containing material. The hard mask layer 109 may include a fluorine-rich layer. The capping layer 130 and the hard mask layer 109 may be made of the same material. The capping layer 130 and the hard mask layer 109 may include fluorine-containing silicon oxide. The capping layer 130 and the hard mask layer 109 may include fluorine-rich silicon oxide. For example, the capping layer 130 and the hard mask layer 109 may include SiOF, fluorinated silicate glass (FSG), or a combination thereof. The capping layer 130 containing fluorine and the hard mask layer 109 containing fluorine may not include silicon nitride.

Referring to FIG. 2D, a first fluorine FD1 may be diffused from the capping layer 130. For example, the first fluorine FD1 may be diffused to an interface F1 (hereinafter, referred to as a 'first interface') between the gate electrode 120 and the gate dielectric layer 110. The first fluorine FD1 may be diffused into the film of the gate dielectric layer 110. The first fluorine FD1 may passivate a trap of the first interface F1, thereby improving retention and row hammer characteristics. The first fluorine FD1 may also be diffused into the interface F2 (hereinafter, referred to as a 'second interface') between the capping layer 130 and the gate dielectric layer 110. A second fluorine FD2 may be diffused into the film of the gate dielectric layer 110.

Diffusion of the first fluorine FD1 and the second fluorine FD2 may be performed by a subsequent thermal processing. Here, the subsequent thermal processing may be performed while forming the bit line structure 140, the storage node contact plug 150, and the capacitor 160 after the formation of the buried gate structure 100G. The first fluorine FD1 and the second fluorine FD2 may diffuse into the gate dielectric layer 110 or into the interface between the gate dielectric layer 110 and the gate electrode 120.

The first interface F1 and the second interface F2 may be vertically continuous with each other. The first interface F1 may be disposed at a lower level than the second interface F2. The first interface F1 may be disposed on both sidewalls of the gate electrode 120.

As described above, the first interface F1 and the second interface F2 may include the first fluorine FD1 diffused from the capping layer 130, and the traps of the first and second interfaces F1 and F2 may be passivated with the diffused first fluorine FD1. In another embodiment, the first and the second interfaces F1 and F2 may each be referred to as a fluorine-passivated interface.

In another embodiment, the first interface F1 and the second interface F2 may each be referred to as a fluorinated passivation layer or a fluorine-containing passivation layer. This is because portions of the gate dielectric layer 110 may include diffused first and second fluorine FD1 and FD2. In other words, the gate dielectric layer 110 may include a fluorine-containing gate dielectric layer 110F and a fluorine-free gate dielectric layer 110U. The fluorine-containing gate dielectric layer 110F may be a layer including the first and second interfaces F1 and F2, and the fluorine-free gate dielectric layer 110U may be a layer not including the first and second interfaces F1 and F2. When the gate dielectric layer 110 is silicon oxide, the fluorine-containing gate dielectric layer 110F may be a fluorinated silicon oxide, and the fluorine-free gate dielectric layer 110U may be a fluorine-free silicon oxide. The fluorine-free silicon oxide may not contain fluorine.

The second fluorine FD2 may diffuse from the hard mask layer 109 to the second interface F2, and traps of the second interface F2 may be passivated with the diffused second fluorine FD2. The second fluorine FD2 may diffuse to the first interface F1. Accordingly, the first and second interfaces F1 and F2 may be passivated with the first fluorine FD1 and the second fluorine FD2. The first interface F1 may include the first fluorine FD1 diffused from the capping layer 130 and the second fluorine FD2 diffused from the hard mask layer 109.

As described above, since the capping layer 130 and the hard mask layer 109 each contain fluorine, retention and row hammer characteristics may be further improved.

When fluorine concentration is large, the capping layer 130 has a decreased dielectric constant as the number of voids are increased therein. When the capping layer 130 is SiOF and when the fluorine concentration in the capping layer 130 is 0 at % (i.e., F-free $SiO_2$), it may have a dielectric constant of about 3.9. When the fluorine concentration in the capping layer 130 is 12 at % (SiOF), the dielectric constant may be lowered to about 3.0. The fluorine concentration in the capping layer 130 may be 1 at % to 25 at %.

Accordingly, since the fluorine-rich capping layer 130 has a low dielectric constant, the parasitic capacitance between the gate electrode 120 and the bit line contact plug 141 may be reduced. The fluorine-rich capping layer 130 may reduce parasitic capacitance between the gate electrode 120 and the bit line 142.

Figure 3A:
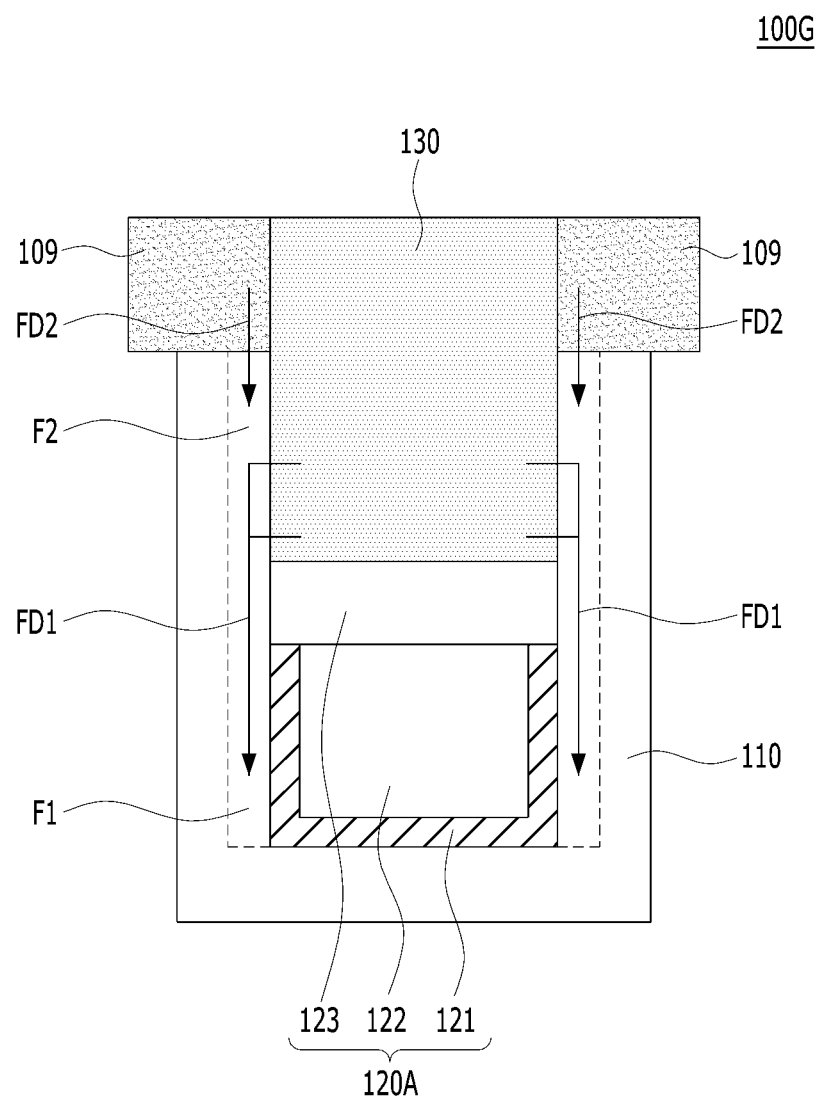
FIGS. 3A to 3C are enlarged views illustrating buried gate structures according to embodiments of the present invention.
Figure 3B:
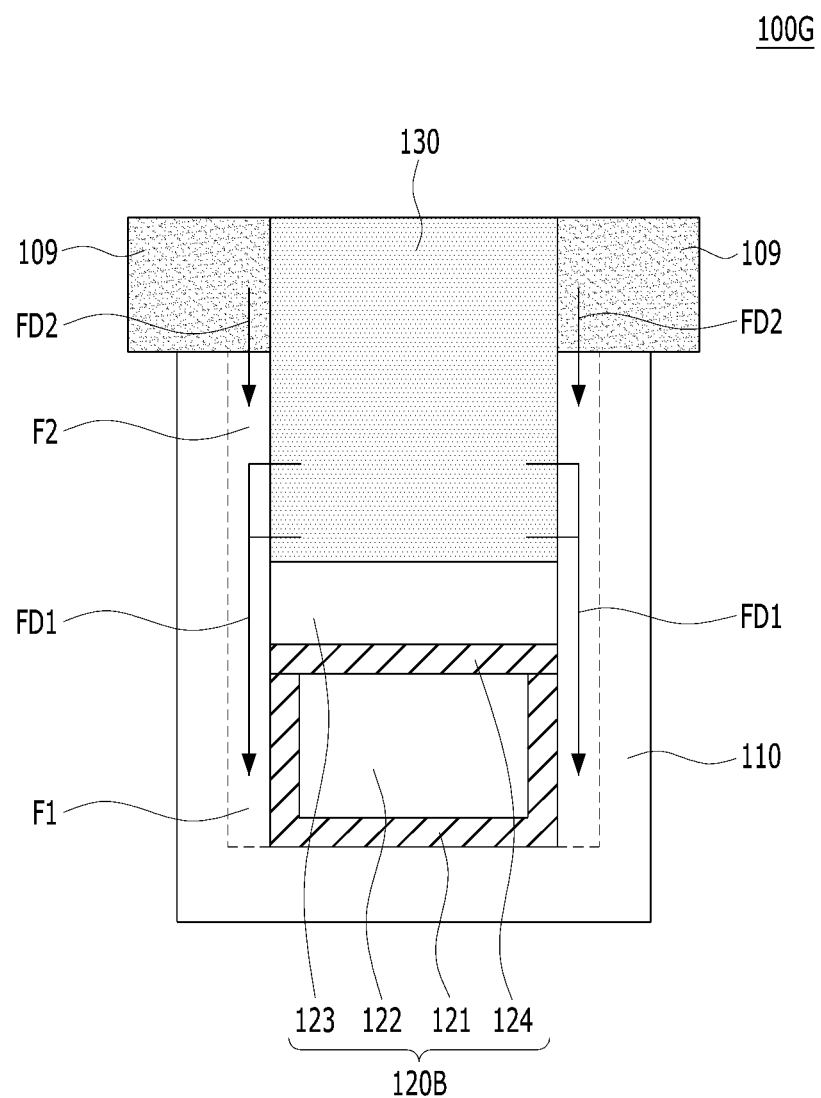
Figure 3C:
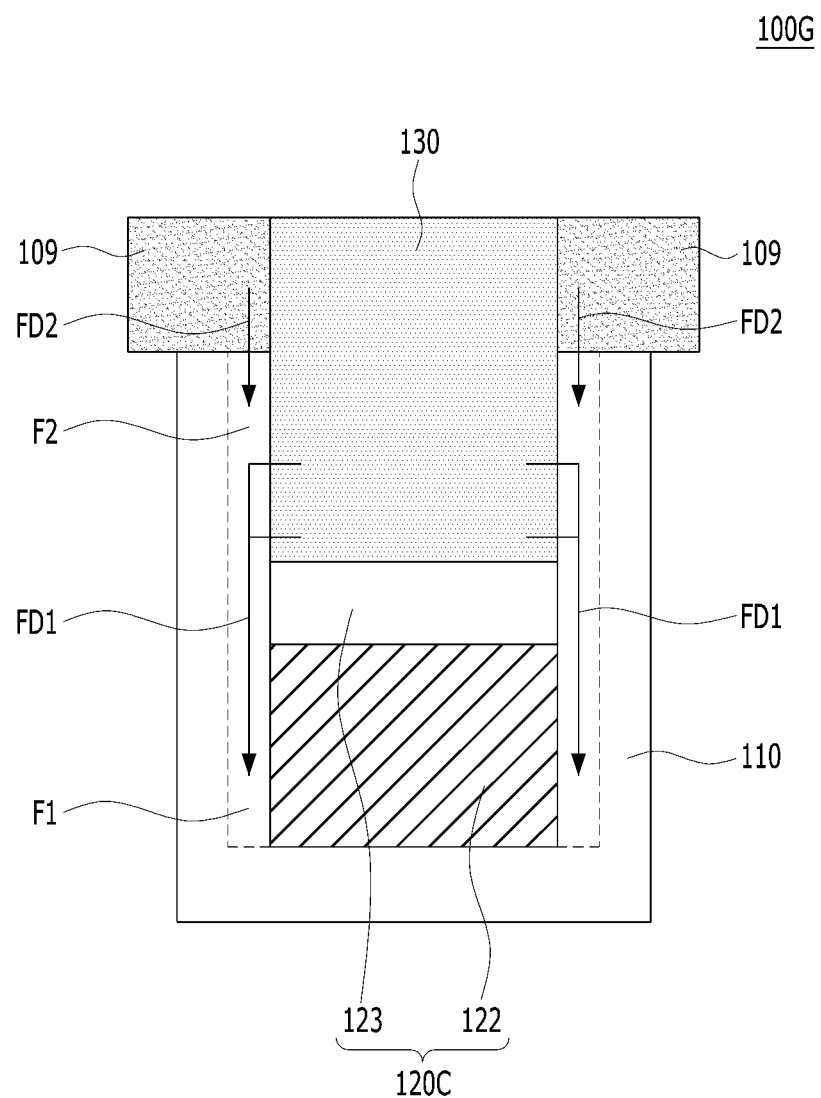

FIGS. 3A to 3C are enlarged views illustrating a buried gate structure according to other embodiments of the present invention. The buried gate structure 100G of FIGS. 3A to 3C may be similar to the buried gate structure 100G of FIGS. 1 to 2D. Hereinafter, detailed descriptions of duplicate components will be omitted.

In FIGS. 3A to 3C, components other than the gate electrodes 120A, 120B, and 120C may be the same as the components of the buried gate structure 100G of FIG. 2D.

Referring to FIG. 3A, the buried gate structure 100G may include a gate dielectric layer 110, a gate electrode 120A, and a capping layer 130. The capping layer 130 and the gate dielectric layer 110 may contact the hard mask layer 109. The gate electrode 120A may include a barrier layer 121, a low resistivity electrode 122, and a low work function electrode 123. For example, the barrier layer 121 may be titanium nitride, the low resistivity electrode 122 may be tungsten, and the low work function electrode 123 may be made, for example, of doped polysilicon. The doped polysilicon may refer to polysilicon doped with an n-type impurity.

Referring to FIG. 3B, the buried gate structure 100G may include a gate dielectric layer 110, a gate electrode 120B, and a capping layer 130. The capping layer 130 and the gate dielectric layer 110 may contact the hard mask layer 109. The gate electrode 120B may include a barrier layer 121, a low resistivity electrode 122, an interface barrier layer 124, and a low work function electrode 123. The barrier layer 121 and the interface barrier layer 124 may be made, for example, of titanium nitride, the low resistivity electrode 122 may be made, for example, of tungsten, and the low work function electrode 123 may be made, for example, of the doped polysilicon. In another embodiment, the interface barrier layer 124 may be formed by plasma nitridation. For example, the barrier layer 121 and the low resistivity electrode 122 may be nitride formed by plasma nitridation. In another embodiment, the interface barrier layer 124 may be oxide portions of the barrier layer 121 and the low resistivity electrode 122.

Referring to FIG. 3C, the buried gate structure 100G may include a gate dielectric layer 110, a gate electrode 120C, and a capping layer 130. The capping layer 130 and the gate dielectric layer 110 may contact the hard mask layer 109. The gate electrode 120C may include a low resistivity electrode 122 and a low work function electrode 123. The low resistivity electrode 122 may be made, for example, of titanium nitride, and the low work function electrode 123 may be made, for example, of doped polysilicon. In another embodiment, the low resistivity electrode 122 may be a high work function titanium nitride, and the low work function electrode 123 may be a low work function titanium nitride.

In FIGS. 3A to 3C, the barrier layer 121, the low resistivity electrode 122, the interface barrier layer 124, and the low work function electrode 123 may be fluorine-free layers. In another embodiment, the low resistivity electrode 122 may be a fluorine-containing layer. The low work function electrode 123 may laterally overlap the first and second doped regions 107 and 108 of FIG. 2A. Gate-induced drain leakage (GIDL) can be suppressed by the low work function electrode 123.

The capping layer 130 may include a fluorine-containing material. The capping layer 130 may include a fluorine-rich layer. The hard mask layer 109 may include a fluorine-containing material. The hard mask layer 109 may include a fluorine-rich layer. The capping layer 130 and the hard mask layer 109 may be made of the same material. The capping layer 130 and the hard mask layer 109 may include fluorine-containing silicon oxide. For example, the capping layer 130 and the hard mask layer 109 may include fluorinated silicon oxide (SiOF), fluoride silicate glass (FSG) or a combination thereof.

The first fluorine FD1 may diffuse from the capping layer 130. For example, the first fluorine FD1 may be diffused into the first interface F1 between the gate electrodes 120A, 120B, and 120C and the gate dielectric layer 110. The first fluorine FD1 may be diffused into the film of the gate dielectric layer 110. The first fluorine FD1 may passivate a trap of the first interface F1, thereby improving retention and row hammer characteristics. The first fluorine FD1 may also diffuse into the second interface F2 between the capping layer 130 and the gate dielectric layer 110. The second fluorine FD2 may be diffused into the film of the gate dielectric layer 110.

The first interface F1 and the second interface F2 may be vertically continuous with each other. The first interface F1 may be disposed at a lower level than the second interface F2. The first interface F1 may be disposed on both sidewalls of the gate electrode 120.

As described above, the first interface F1 and the second interface F2 may include the first fluorine FD1 diffused from the capping layer 130, and the traps of the first and second interfaces F1 and F2 may be passivated with the diffused first fluorine FD1.

The second fluorine FD2 may diffuse from the hard mask layer 109 to the second interface F2, and traps of the second interface F2 may be passivated with the diffused second fluorine FD2. The second fluorine FD2 may diffuse to the first interface F1. Accordingly, the first and second interfaces F1 and F2 may be passivated with the first fluorine FD1 and the second fluorine FD2. The first interface F1 may include first fluorine FD1 diffused from the capping layer 130 and second fluorine FD2 diffused from the hard mask layer 109.

FIGS. 4A to 4D are enlarged views illustrating buried gate structures according to other embodiments of the present invention. The buried gate structure 200G of FIGS. 4A to 4D may be similar to the buried gate structure 100G of FIGS. 1 to 3C. Hereinafter, detailed descriptions of duplicate components will be omitted.

Figure 4A:
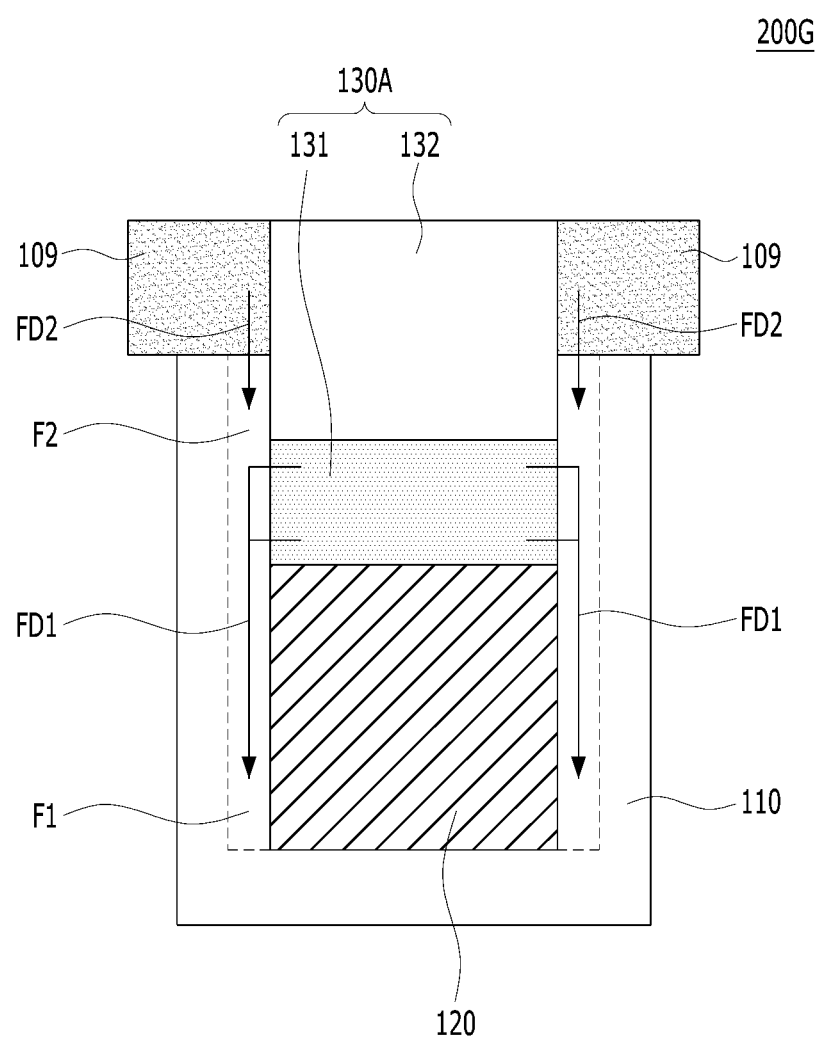
FIGS. 4A to 4D are enlarged views illustrating buried gate structures according to embodiments of the present invention.

Referring to FIG. 4A, the buried gate structure 200G may include a gate dielectric layer 110, a gate electrode 120, and a capping layer 130A. A hard mask layer 109 may be formed on both sidewalls of the capping layer 130A, and the gate dielectric layer 110 may be formed below the hard mask layer 109.

The capping layer 130A may include a stack of a fluorine-containing capping layer 131 and a fluorine-free capping layer 132. The fluorine-containing capping layer 131 may contact the gate dielectric layer 110 and may not contact the hard mask layer 109. The fluorine-free capping layer 132 may contact the gate dielectric layer 110 and the hard mask layer 109. The fluorine-containing capping layer 131 may be thinner than the fluorine-free capping layer 132. The fluorine-containing capping layer 131 may include SiOF or FSG, and the fluorine-free capping layer 132 may include silicon oxide or silicon nitride.

The hard mask layer 109 may include a fluorine-containing material. The hard mask layer 109 may include SiOF or FSG.

Referring to FIG. 4A, the first fluorine FD1 may be diffused from the fluorine-containing capping layer 131. For example, the first fluorine FD1 may be diffused into the first interface F1 between the gate electrode 120 and the gate dielectric layer 110. The first fluorine FD1 may be diffused into the film of the gate dielectric layer 110. The first fluorine FD1 may passivate a trap of the first interface F1. The first fluorine FD1 may also diffuse into the second interface F2 between the fluorine-containing capping layer 131 and the gate dielectric layer 110. The second fluorine FD2 may be diffused into the film of the gate dielectric layer 110. The second interface F2 may further include an interface between the fluorine-free capping layer 132 and the gate dielectric layer 110.

The first interface F1 and the second interface F2 may be vertically continuous with each other. The first interface F1 may be disposed at a lower level than the second interface F2. The first interface F1 may be disposed on both sidewalls of the gate electrode 120.

As described above, the first interface F1 and the second interface F2 may include the first fluorine FD1 diffused from the fluorine-containing capping layer 131, and the traps of the first and the second interfaces F1 and F2 may be passivated with the diffused first fluorine FD1.

The second fluorine FD2 may diffuse from the hard mask layer 109 to the second interface F2, and traps of the second interface F2 may be passivated with the diffused second fluorine FD2. The second fluorine FD2 may diffuse to the first interface F1. Accordingly, the first and second interfaces F1 and F2 may be passivated with the first fluorine FD1 and the second fluorine FD2. The first interface F1 may include the first fluorine FD1 diffused from the fluorine-containing capping layer 131 and the second fluorine FD2 diffused from the hard mask layer 109.

Figure 4B:
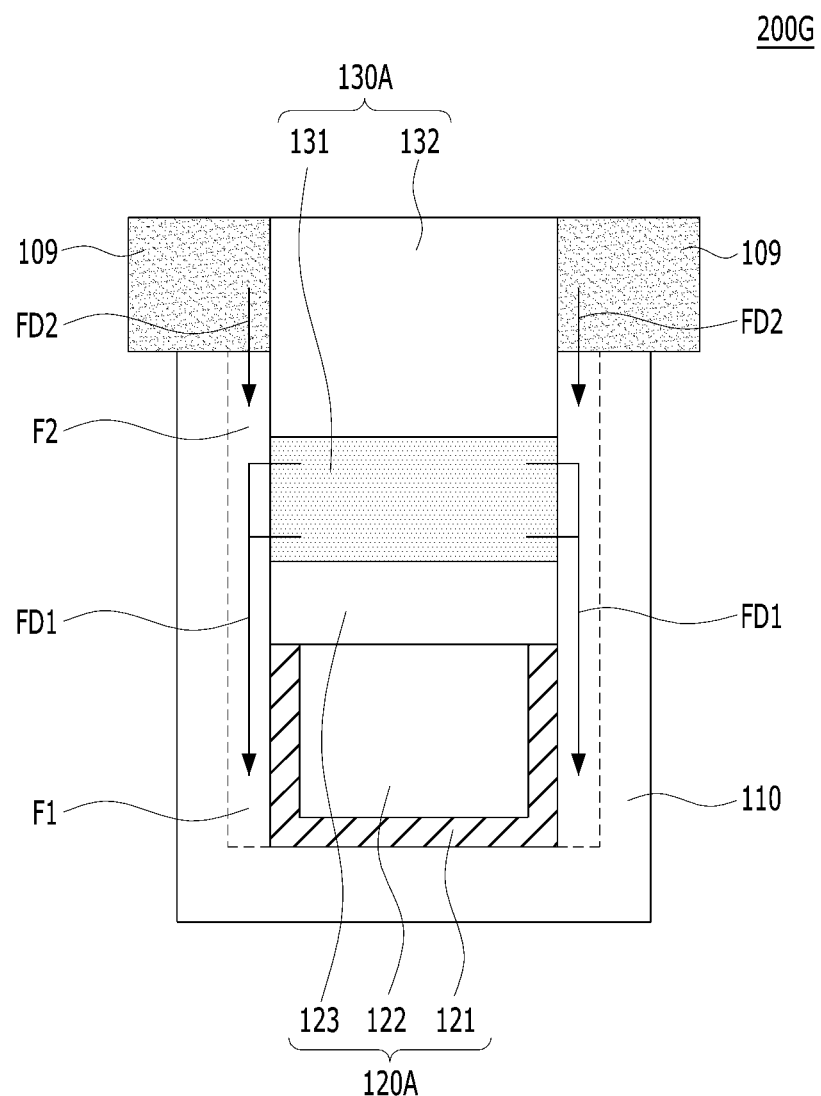
Figure 4C:
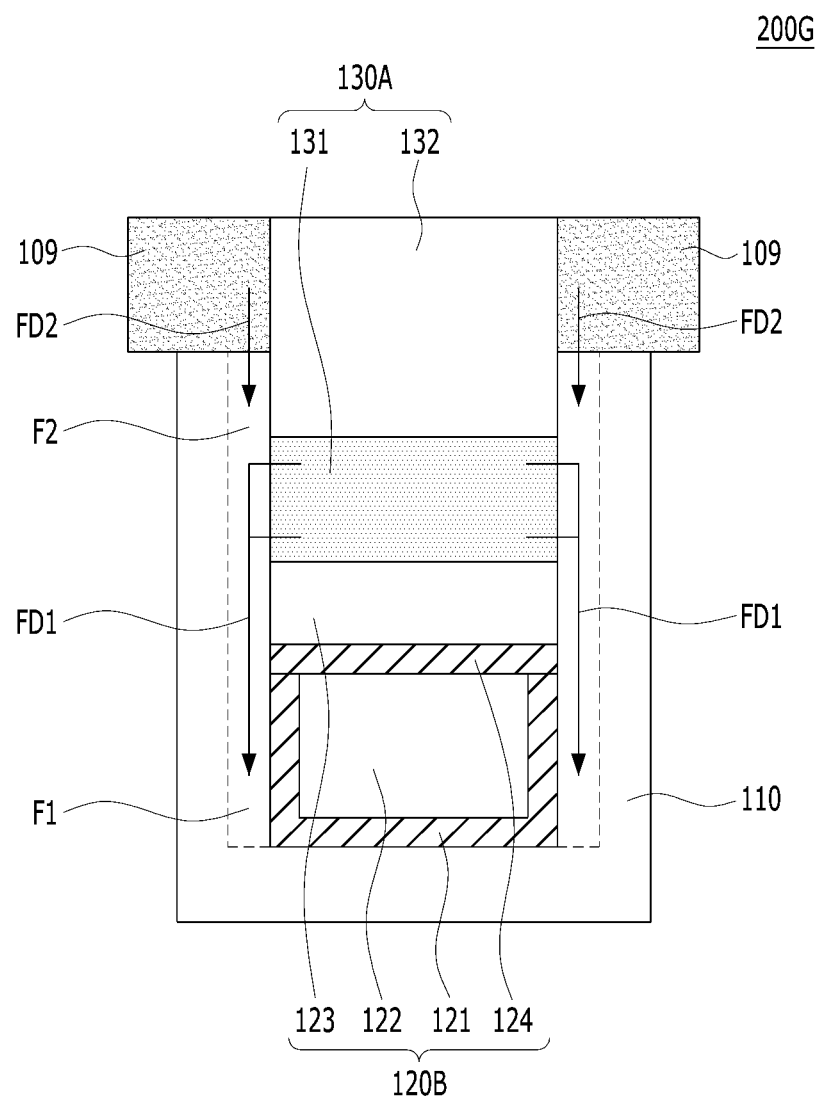
Figure 4D:
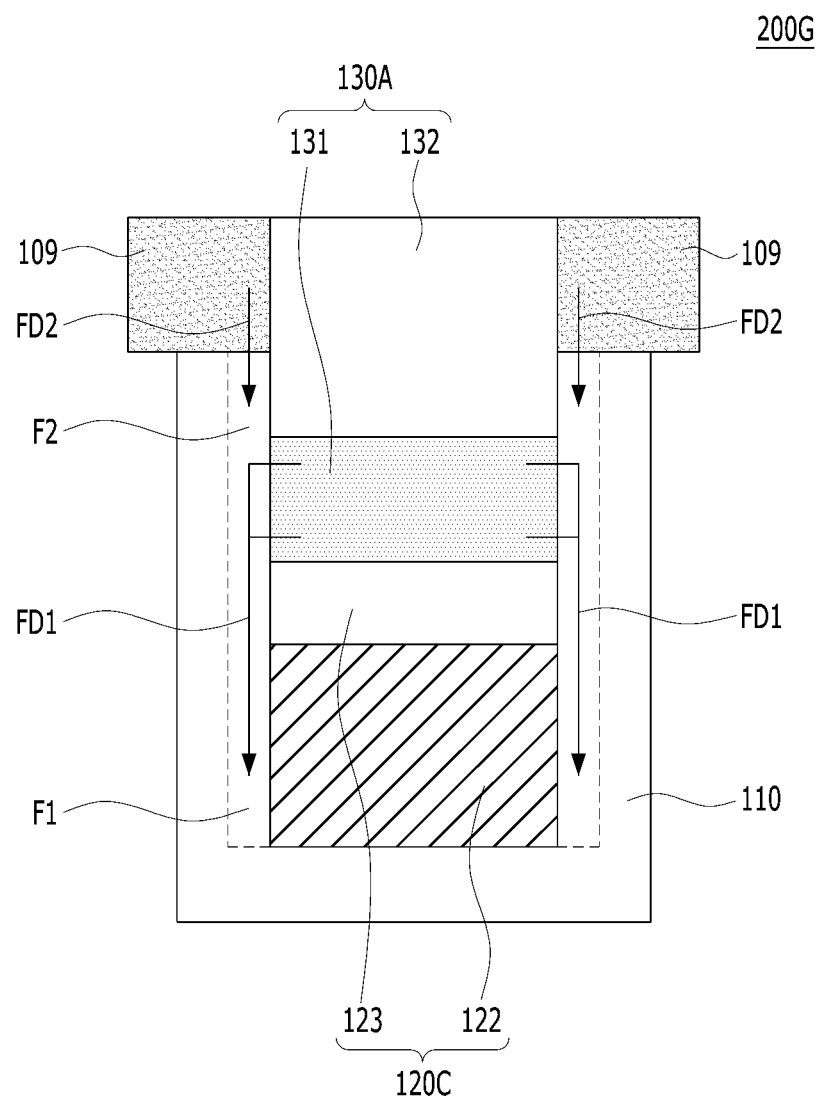

In FIGS. 4B to 4D, components other than the gate electrodes 120A, 120B, and 120C may be the same as the components of the buried gate structure 200G of FIG. 4A. Hereinafter, detailed descriptions of duplicate components will be omitted.

Referring to FIG. 4B, the buried gate structure 200G may include a gate dielectric layer 110, a gate electrode 120A, and a capping layer 130A. The capping layer 130A and the gate dielectric layer 110 may contact the hard mask layer 109. The gate electrode 120A may include a barrier layer 121, a low resistivity electrode 122, and a low work function electrode 123. For example, the barrier layer 121 may be titanium nitride, the low resistivity electrode 122 may be tungsten, and the low work function electrode 123 may be made, for example, of doped polysilicon. The doped polysilicon may refer to polysilicon doped with an n-type impurity.

Referring to FIG. 4C, the buried gate structure 200G may include a gate dielectric layer 110, a gate electrode 120B, and a capping layer 130A. The capping layer 130A and the gate dielectric layer 110 may contact the hard mask layer 109. The gate electrode 120B may include a barrier layer 121, a low resistivity electrode 122, an interface barrier layer 124, and a low work function electrode 123. The barrier layer 121 and the interface barrier layer 124 may be made, for example, of titanium nitride, the low resistivity electrode 122 may be made, for example, of tungsten, and the low work function electrode 123 may be made, for example, of doped polysilicon. In another embodiment, the interface barrier layer 124 may be formed by plasma nitridation. For example, the barrier layer 121 and the low resistivity electrode 122 may be nitride formed by plasma nitridation. In another embodiment, the interface barrier layer 124 may be oxide portions of the barrier layer 121 and the low resistivity electrode 122.

Referring to FIG. 4D, the buried gate structure 200G may include a gate dielectric layer 110, a gate electrode 120C, and a capping layer 130A. The capping layer 130A and the gate dielectric layer 110 may contact the hard mask layer 109. The gate electrode 120C may include a low resistivity electrode 122 and a low work function electrode 123. The low resistivity electrode 122 may be made, for example, of titanium nitride, and the low work function electrode 123 may be made, for example, of doped polysilicon. In another embodiment, the low resistivity electrode 122 may be a high work function titanium nitride, and the low work function electrode 123 may be a low work function titanium nitride.

In FIGS. 4B to 4D, the barrier layer 121, the low resistivity electrode 122, the interface barrier layer 124, and the low work function electrode 123 may be fluorine-free layers. In another embodiment, the low resistivity electrode 122 may be a fluorine-containing layer. Gate-induced drain leakage (GIDL) may be suppressed by the low work function electrode 123.

FIGS. 5A to 5D are enlarged views illustrating a buried gate structure according to other embodiments of the present invention. The buried gate structures 300G of FIGS. 5A to 5D may be similar to the buried gate structures 100G and 200G of FIGS. 1 to 4D. Hereinafter, detailed descriptions of duplicate components will be omitted.

Figure 5A:
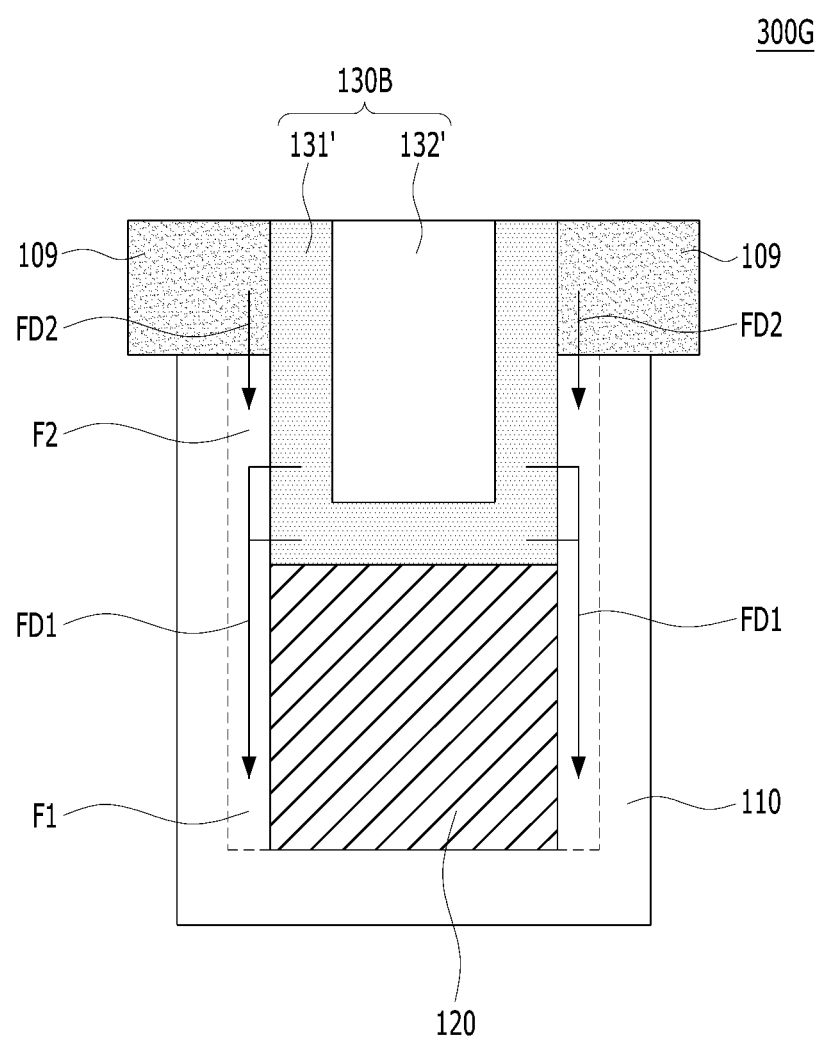

Referring to FIG. 5A, the buried gate structure 300G may include a gate dielectric layer 110, a gate electrode 120, and a capping layer 130B. A hard mask layer 109 may be formed on both sidewalls of the capping layer 130B, and the gate dielectric layer 110 may be formed below the hard mask layer 109.

The capping layer 130B may include a stack of a fluorine-containing capping layer 131' and a fluorine-free capping layer 132'. The fluorine-containing capping layer 131' may be conformally formed, and the fluorine-free capping layer 132' may be formed to be thicker than the fluorine-containing capping layer 131'. The fluorine-containing capping layer 131' may contact the gate electrode 120, the gate dielectric layer 110, and the hard mask layer 109. The fluorine-free capping layer 132' may not contact the gate dielectric layer 110 and the hard mask layer 109. The fluorine-containing capping layer 131' may include SiOF or FSG, and the fluorine-free capping layer 132' may include silicon oxide or silicon nitride.

The hard mask layer 109 may include a fluorine-containing material. The hard mask layer 109 may include SiOF or FSG.

Referring to FIG. 5A, the first fluorine FD1 may be diffused from the fluorine-containing capping layer 131'. For example, the first fluorine FD1 may be diffused into the first interface F1 between the gate electrode 120 and the gate dielectric layer 110. The first fluorine FD1 may be diffused into the film of the gate dielectric layer 110. The first fluorine FD1 may passivate a trap of the first interface F1. The first fluorine FD1 may also diffuse into the second interface F2 between the fluorine-containing capping layer 131' and the gate dielectric layer 110. The second fluorine FD2 may be diffused into the film of the gate dielectric layer 110.

The first interface F1 and the second interface F2 may be vertically continuous with each other. The first interface F1 may be disposed at a lower level than the second interface F2. The first interface F1 may be disposed on both sidewalls of the gate electrode 120.

As described above, the first interface F1 and the second interface F2 may include the first fluorine FD1 diffused from the fluorine-containing capping layer 131', and the traps of the first and second interfaces F1 and F2 may be passivated with the diffused first fluorine FD1.

The second fluorine FD2 may diffuse from the hard mask layer 109 to the second interface F2, and traps of the second interface F2 may be passivated with the diffused second fluorine FD2. The second fluorine FD2 may diffuse to the first interface F1. Accordingly, the first and second interfaces F1 and F2 may be passivated with the first fluorine FD1 and the second fluorine FD2. The first interface F1 may include first fluorine FD1 diffused from the fluorine-containing capping layer 131' and second fluorine FD2 diffused from the hard mask layer 109.

Figure 5B:
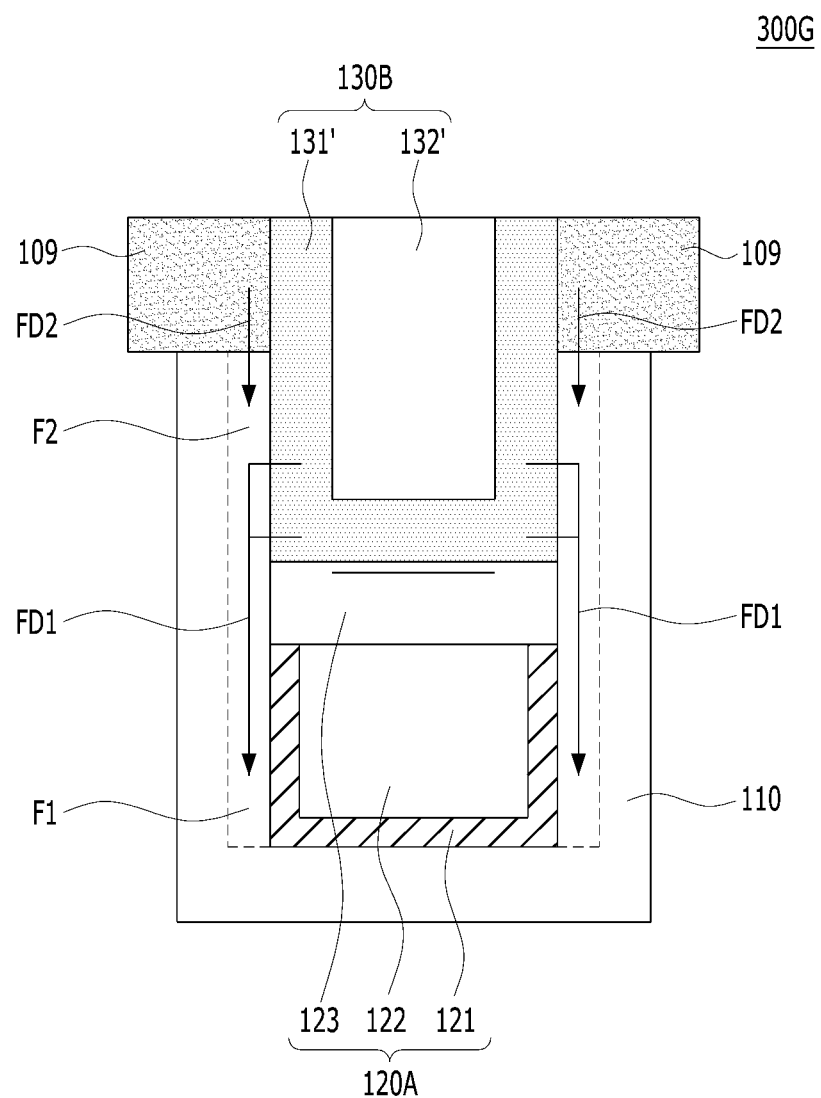
Figure 5D:
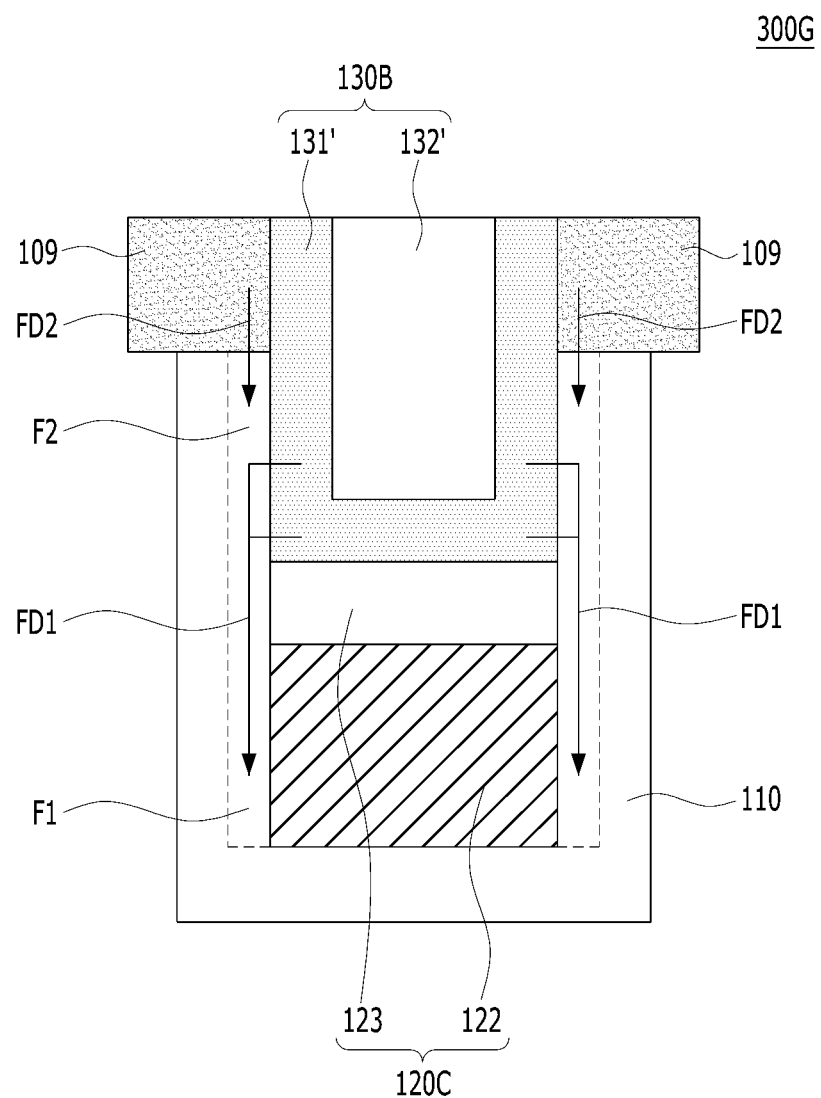

In FIGS. 5B to 5D, components other than the gate electrodes 120A, 120B, and 120C may be the same as the components of the buried gate structure 300G of FIG. 5A. Hereinafter, detailed descriptions of duplicate components will be omitted.

Referring to FIG. 5B, the buried gate structure 300G may include a gate dielectric layer 110, a gate electrode 120A, and a capping layer 130B. The capping layer 130B and the gate dielectric layer 110 may contact the hard mask layer 109. The gate electrode 120A may include a barrier layer 121, a low resistivity electrode 122, and a low work function electrode 123. The barrier layer 121 may be made, for example, of titanium nitride, the low resistivity electrode 122 may be made, for example, of tungsten, and the low work function electrode 123 may be made, for example, of doped polysilicon. The doped polysilicon may refer to polysilicon doped with an n-type impurity.

Referring to FIG. 5C, the buried gate structure 300G may include a gate dielectric layer 110, a gate electrode 120B, and a capping layer 130B. The capping layer 130B and the gate dielectric layer 110 may contact the hard mask layer 109. The gate electrode 120B may include a barrier layer 121, a low resistivity electrode 122, an interface barrier layer 124, and a low work function electrode 123. The barrier layer 121 and the interface barrier layer 124 may be made, for example, of titanium nitride, the low resistivity electrode 122 may be made, for example, of tungsten, and the low work function electrode 123 may be made, for example, of doped polysilicon. In another embodiment, the interface barrier layer 124 may be formed by plasma nitridation. For example, the barrier layer 121 and the low resistivity electrode 122 may be nitride formed by plasma nitridation. In another embodiment, the interface barrier layer 124 may be oxide portions of the barrier layer 121 and the low resistivity electrode 122.

Referring to FIG. 5D, the buried gate structure 300G may include a gate dielectric layer 110, a gate electrode 120C, and a capping layer 130B. The capping layer 130B and the gate dielectric layer 110 may contact the hard mask layer 109. The gate electrode 120C may include a low resistivity electrode 122 and a low work function electrode 123. The low resistivity electrode 122 may be made, for example, of titanium nitride, and the low work function electrode 123 may be made, for example, of doped polysilicon. In another embodiment, the low resistivity electrode 122 may be a high work function titanium nitride, and the low work function electrode 123 may be a low work function titanium nitride.

In FIGS. 5B to 5D, the barrier layer 121, the low resistivity electrode 122, the interface barrier layer 124, and the low work function electrode 123 may be fluorine-free layers. In another embodiment, the low resistivity electrode 122 may be a fluorine-containing layer. Gate-induced drain leakage (GIDL) may be suppressed by the low work function electrode 123.

In FIGS. 3A, 4B, and 5B, the barrier layer 121, the low resistivity electrode 122, and the low work function electrode 123 may include, for example, titanium nitride, tungsten, and doped polysilicon, respectively.

In FIGS. 3B, 4C, and 5C, the barrier layer 121, the low resistivity electrode 122, the interface barrier layer 124, and the low work function electrode 123 may include, for example, a first titanium nitride, tungsten, a second titanium nitride, and doped polysilicon, respectively.

In FIGS. 3C, 4D, and 5D, the low resistivity electrode 122 and the low work function electrode 123 may include, for example, titanium nitride and doped polysilicon, respectively. In another embodiment, the low resistivity electrode 122 may include high work function titanium nitride, and the low work function electrode 123 may include low work function titanium nitride. The high work function titanium nitride may be a titanium-rich titanium nitride, and the low work function titanium nitride may be a nitrogen-rich titanium nitride. In another embodiment, the low resistivity electrode 122 may include stoichiometric titanium nitride, and the low work function electrode 123 may include low work function titanium nitride. The stoichiometric ratio of titanium and nitrogen required for synthesis of titanium nitride is 1:1.

The present invention described above is not limited to the above-described embodiments and the accompanying drawings, and it will be apparent to those skilled in the art that various substitutions, modifications, and changes may be made thereto without departing from the spirit and scope of the present invention.

What is claimed is:

1. A semiconductor device, comprising:
a substrate;
a first fluorine-containing layer over the substrate;
a trench formed in the first fluorine-containing layer and extended into the substrate;
a gate dielectric layer formed over the trench;
a gate electrode formed over the gate dielectric layer and filling a portion of the trench;
a second fluorine-containing layer formed over to directly contact the gate electrode; and
a fluorine-containing passivation layer between the gate dielectric layer and the gate electrode,
wherein a bottom surface of the first fluorine-containing layer covers a top surface of the gate dielectric layer and a top surface of the fluorine-containing passivation layer.

2. The semiconductor device of claim 1, wherein the fluorine-containing passivation layer includes fluorine diffused from the first and second fluorine-containing layers.

3. The semiconductor device of claim 1, wherein the gate dielectric layer includes silicon oxide (SiO2) and the fluorine-containing passivation layer includes fluorinated silicon oxide (SiOF).

4. The semiconductor device of claim 1, wherein the fluorine-containing passivation layer directly contacts sidewalls of the gate electrode.

5. The semiconductor device of claim 1, wherein the first and second fluorine-containing layers include fluorinated silicon oxide (SiOF), fluoride silicate glass (FSG), or a combination thereof.

6. The semiconductor device of claim 1, further including a fluorine-free layer over the second fluorine-containing layer,
wherein the fluorine-free layer includes a material having a higher dielectric constant than the second fluorine-containing layer.

7. The semiconductor device of claim 6, wherein the fluorine-free layer includes silicon nitride.

8. The semiconductor device of claim 1, further including:
a first doped region and a second doped region formed in the substrate on both sides of the trench;
a bit line contact plug formed over the first doped region;
a bit line formed over the bit line contact plug;
a storage node contact plug formed over the second doped region; and
a capacitor formed over the storage node contact plug.

9. The semiconductor device of claim 1, wherein the gate electrode includes a fluorine-free conductive layer, a fluorine-containing conductive layer, or a combination thereof.

10. The semiconductor device of claim 1, wherein the gate electrode includes polysilicon, metal, metal nitride, or a combination thereof.

11. The semiconductor device of claim 1, wherein the gate electrode is formed only of titanium nitride.

12. The semiconductor device of claim 1, wherein the gate electrode includes a stack of titanium nitride, tungsten, and doped polysilicon.

13. The semiconductor device of claim 1, wherein the gate electrode includes a stack of a first titanium nitride, tungsten, a second titanium nitride, and doped polysilicon.

14. The semiconductor device of claim 1, wherein the gate electrode includes a stack of titanium nitride and doped polysilicon.

15. A semiconductor device comprising:
a substrate including a first doped region and a second doped region;
a first fluorinated silicon oxide (SiOF) layer over the substrate;
a trench formed in the first SiOF layer and extended into the substrate between the first and second doped regions;
a gate dielectric layer formed over the trench;
a gate electrode filling a portion of the trench over the gate dielectric layer and including fluorine-free titanium nitride;
a second SiOF layer formed over to directly contact the gate electrode; and
a fluorine-containing passivation layer between the gate dielectric layer and the gate electrode,
wherein a top surface of the first SiOF layer covers a top surface of the gate dielectric layer and a top surface of the fluorine-containing passivation layer.

16. The semiconductor device of claim 15, wherein the gate dielectric layer includes silicon oxide (SiO2) and the fluorine-containing passivation layer includes SiOF.

17. The semiconductor device of claim 15, wherein the gate electrode further includes a low work function material over the fluorine-free titanium nitride, and the low work function material horizontally overlaps the first and second doped regions.

18. The semiconductor device of claim 17, wherein the low work function material includes doped polysilicon.

19. The semiconductor device of claim 15, further including:
a bit line contact plug formed over the first doped region;
a bit line formed over the bit line contact plug;
a storage node contact plug formed over the second doped region; and
a capacitor formed over the storage node contact plug.

20. The semiconductor device of claim 1, wherein the second fluorine-containing layer is formed of a silicon nitride-free material.

21. The semiconductor device of claim 15, wherein the fluorine-containing passivation layer includes fluorine diffused from the first and second SiOF layers.

22. The semiconductor device of claim 15, wherein the second SiOF layer is formed of a silicon nitride-free material.

* * * * *